United States Patent
Wong et al.

(10) Patent No.: US 6,692,902 B2
(45) Date of Patent: Feb. 17, 2004

(54) MANUFACTURING METHOD AND STRUCTURE OF SLANTING DIFFUSIVE REFLECTOR

(75) Inventors: Yi-Chun Wong, Tainan (TW); Ming-Dar Wei, Kaohsiun (TW); Shang-Wen Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 90 days.

(21) Appl. No.: 09/988,057

(22) Filed: Nov. 16, 2001

(65) Prior Publication Data

US 2003/0096198 A1 May 22, 2003

(51) Int. Cl.⁷ .............................. G03F 7/00; G03F 9/00; G03B 5/00; G03B 27/00
(52) U.S. Cl. ........................ 430/322; 430/5; 430/321; 430/323; 430/325; 430/396; 359/580; 359/581; 359/585; 359/613
(58) Field of Search ................................. 430/321, 322, 430/323, 325, 331, 396, 5; 359/580, 581, 585, 613

(56) References Cited

U.S. PATENT DOCUMENTS 6,163,405 A * 12/2000 Chang et al. ............... 359/599

* cited by examiner

Primary Examiner—Mark F. Huff
Assistant Examiner—Kripa Sagar
(74) Attorney, Agent, or Firm—Birch, Stewart, Kolasch & Birch, LLP

(57) ABSTRACT

A manufacturing method and structure of slanting diffusive reflectors simplifies their manufacturing process and reduces cost. A photo mask comprising a plurality of half-tone exposure units is used. A half-tone photolithography process is performed on the positive photoresist formed on a substrate. Only one exposure process and a suitable drying step are required to form a plurality of slants and rough astigmatisms on the slants. The size of the half-tone exposure units is randomly selected. Each half-tone exposure unit comprises a plurality of parallel transmitting strips or shadow strips. The pitch of the transmitting strips or the shadow strips in one half-tone exposure unit can be arbitrary. The width of the shadow strips is gradually changing from one side of the half-tone exposure unit to the other side.

9 Claims, 5 Drawing Sheets

MANUFACTURING METHOD AND STRUCTURE OF SLANTING DIFFUSIVE REFLECTOR

BACKGROUND OF THE INVENTION

1. Field of the Invention

The present invention relates to a diffusive reflector applied in a reflective LCD, and especially relates to the process and structure of a slanting diffusive reflector.

2. Related Art

A reflective LCD usually comprises an upper polarizer, a liquid crystal cell, a lower polarizer and a diffusive reflector. The liquid crystal cell consists of two parallel glass laminates and liquid crystal material filled in the space between the two glass laminates. Alignment layers and transparent electrode films are formed on the inner surfaces of the two glass laminates. Generally speaking, users view images from the LCD in an orthogonal direction and light is transmitted into the LCD in a non-orthogonal direction. For example, light is transmitted from somewhere above the LCD in a direction of twelve o'clock to the LCD. Light passes through the upper polarizer, the liquid crystal cell, the lower polarizer and is then reflected by the diffusive reflector, passing through the lower polarizer, the liquid crystal cell, the upper polarizer and finally becomes a signal light and observable by the human eye. How to design a good diffusive reflector with high light efficiency is an important issue in reflective LCD structure. How to increase the intensity of the light to be viewed and how to simplify the manufacturing process are important issues for manufacturing diffusive reflectors. The slanting diffusive reflector comprises an angle that enables incident light and signal light to have non-mirror image reflection so the signal light and glare generated by the glass laminate (or polarizer) can be separated and the incident light utilization rate is increased. Therefore, the quality of the reflective LCD is increased.

The conventional method of manufacturing slanting diffusive reflectors requires two different photo masks for two different light exposure processes. Usually, a photo resist on a substrate is exposed to form slants and then exposed again to form bumps for astigmatism on the slants. The traditional method requires two exposures so the manufacturing process is very complicated and the cost of production is very high. Therefore, it is necessary to provide a new manufacturing process and structure of slanting diffusive reflectors.

SUMMARY OF THE INVENTION

Accordingly, the object of the invention is to simplify the manufacturing process and reduce cost, so a new manufacturing process and structure of slanting diffusive reflector are proposed.

To obtain this object, a special photo resist is used in order to perform half-tone photolithography to a positive photoresist on a substrate. Only one photolithography process is required to form a slanting structure and bumps on the photo mask. The special photo mask comprises a plurality of half-tone exposure units. The size of the half-tone exposure units can be arranged arbitrarily. Each half-tone exposure unit comprises a plurality of parallel transmitting strips or shadow strips. The transmitting strips or shadow strips have suitable but arbitrary shapes. Arbitrary pitch can be obtained between the transmitting strips or the shadow strips in the same half-tone exposure unit. The width of the transmitting strip or the shadow strip can be increasing all the way from one side of the half-tone exposure unit to the other side (or decreasing in the opposite direction). As soon as the photo mask is used to perform out of focus exposure on the photoresist, the distance between the photoresist and focus is adjusted so the light penetrates the half-tone exposure units and generates zigzag light intensity (light intensity is changing from strong to weak or from weak to strong) distribution on the photoresist. After the above out of focus exposure process is performed, a suitable developing process and dry process are also performed to form a plurality of randomly sized bumps for astigmatism on the slants.

The manufacturing method of a slanting diffusive reflector comprises the following steps: provide a substrate upon which a positive photoresist is formed, for example, the photoresist can be PC403, PC409 or PC452; provide a photo mask that comprises a plurality of half-tone exposure units, each half-tone exposure unit comprises a plurality of parallel transmitting strips or shadow strips; arbitrary pitch can be obtained between the transmitting strips or the shadow strips in the same half-tone exposure unit and the widths of the shadow strips are gradually decreasing from one side to the other; the photo mask is used to form slants containing a plurality of bumps; finally, dry the photoresist. It is better if the size of the half-tone exposure unit, the pitch between the transmitting strips or the shadow strips and the gradually changing width of the transmitting strips or the shadow strips in the half-tone exposure unit are distributed arbitrarily within the range of a LCD pixel corresponding to the photo mask. This allows the slants on the photoresist to provide better astigmatic ability after combining the subsequent processes.

The process mentioned above for drying the photoresist involves solidifying the slants of the photoresist after they are developed. The photoresist flows when it is heated up before it is completely solidified, so the bumps on the slants become less distinguished and decrease the photoresist's astigmatic ability. A better method for drying the photoresist comprises following steps: dry the photoresist at 100–150° C. for 5–30 minutes, then hard bake at about 200° C. for over one hour. In this case, the fluid behavior of the photoresist, which makes the bumps less prominent, is reduced.

Furthermore, the structure of the slanting diffusive reflector of the invention comprises a substrate, a photoresist formed on the substrate, a plurality of slants formed on the photoresist, and a plurality of bumps formed on each of the slants. The bumps for providing astigmatism can be ripples. The edge length of the slants can be about 10–40 micrometers. A better condition is to have randomly sized slants within the range of one pixel in order to provide better astigmatic ability. The pitch between ripples in different slants can also be randomly arranged.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given herein below. However, the following description is for purposes of illustration only, and thus is not limitative of the invention, wherein.

DETAILED DESCRIPTION OF THE INVENTION

Figure 1:
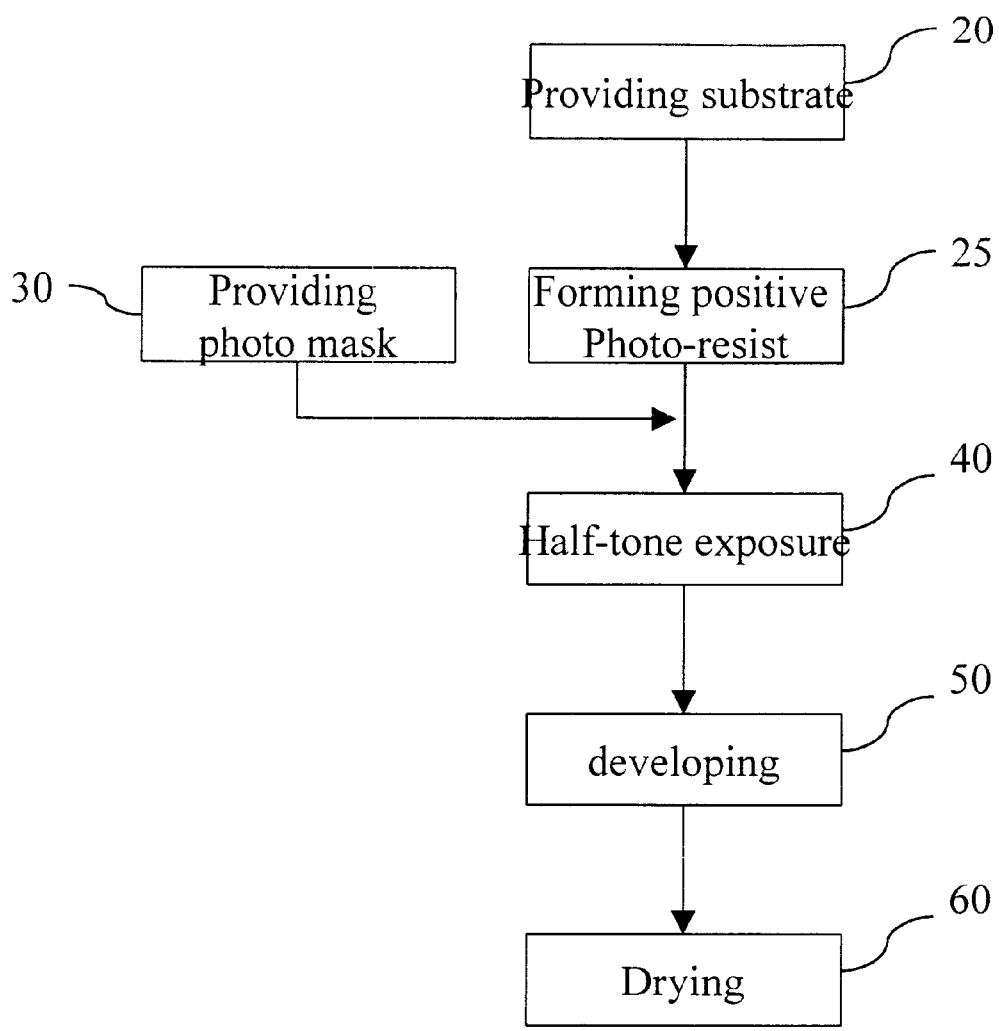
FIG. 1 illustrates flow chart for manufacturing slanting diffusive reflectors of the invention.

For the manufacturing method of the slanting diffusive reflector disclosed in the invention, please refer to FIG. 1. Provide a substrate 20, which can be metal substrate, glass substrate, plastic substrate or any other suitable substrate. A positive photoresist 25 is formed on the substrate 20. The positive photoresist can be a positive photoresist PC403 made by the Japanese company JSR.

Figure 2:
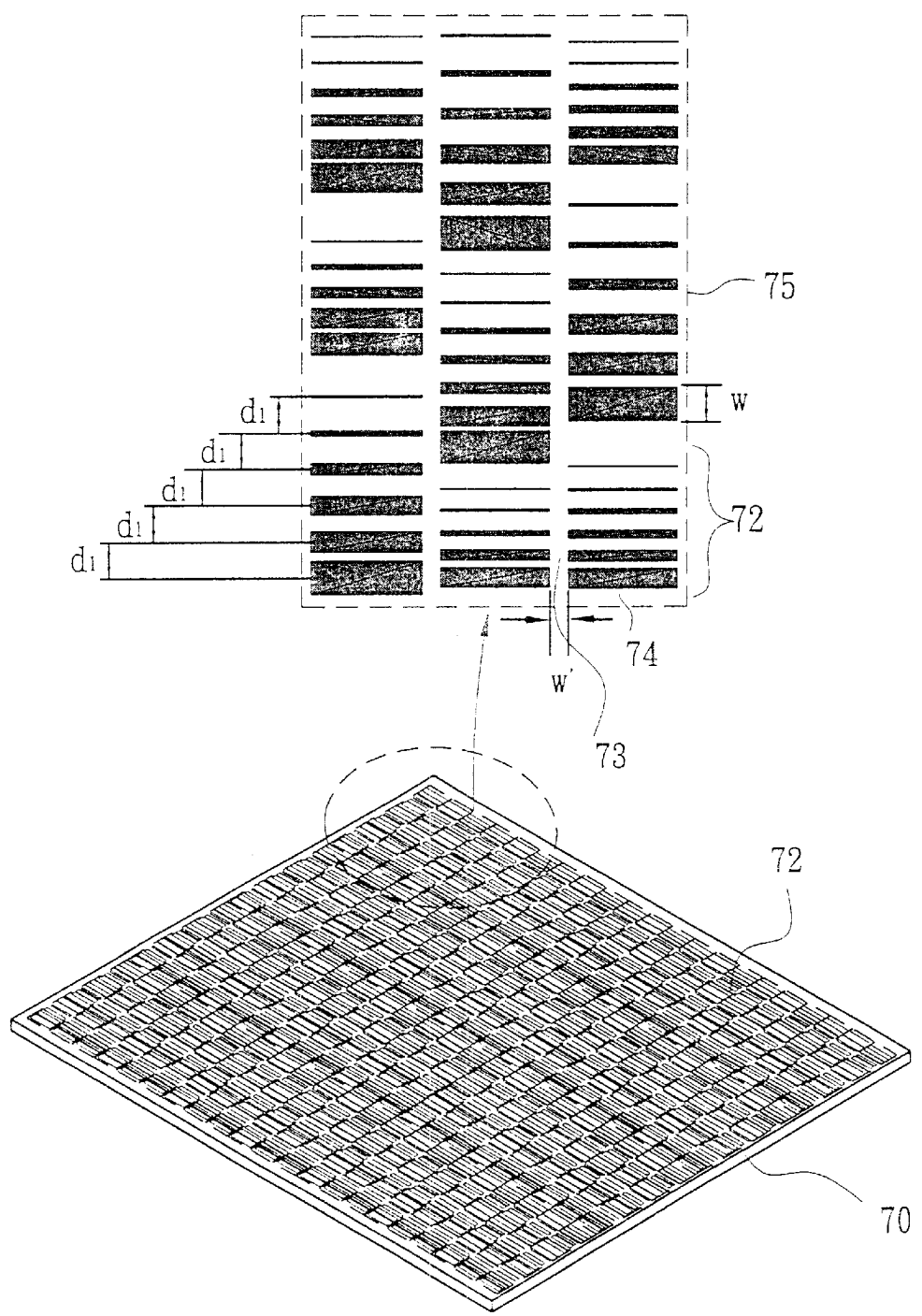
FIG. 2 illustrates a photo mask structure containing a plurality of Half-Tone exposure units of the invention.

Then, provide a special photo mask 30. As shown in FIG. 2, the photo mask 70 contains a plurality of half-tone exposure units 72 for performing out of focus half-tone exposure 40 to the substrate. Each half-tone exposure units 72 contains a plurality of parallel shadow strips 74. The pitch between the shadow strips 74 can be fixed in a same half-tone exposure unit 72. The width of the shadow strips 74 is gradually increased (or gradually decreased) from one side of the half-tone exposure unit 72 to the other side. The way the width of the shadow strips is changed can be adjusted. It is better if the size of the half-tone exposure unit 72, the pitch between the shadow strips and the gradually changing width of the shadow strips in different half-tone exposure units 72 are distributed arbitrarily within the range 75 of an LCD pixel corresponding to the photo mask 70. This allows the randomly distributed slants on the photoresist to provide better astigmatic ability after combining the subsequent out of focus exposure step 40 and the developing step 50. Those who are familiar with this field should understand that the invention is not limited in randomly distributing slants of different sizes within the range of one pixel. The photo mask can also be designed to have randomly distributed slants of different sizes in all areas. Each half-tone exposure units 72 has a neighboring light transmitting area 73. The width of the light transmitting area 73 is, for example, 1–3 micrometers. This is to enable the slants corresponding to the half-tone exposure units 72 to have a round surface in the horizontal direction. The light diffusivity is thus increased.

Figure 3B:
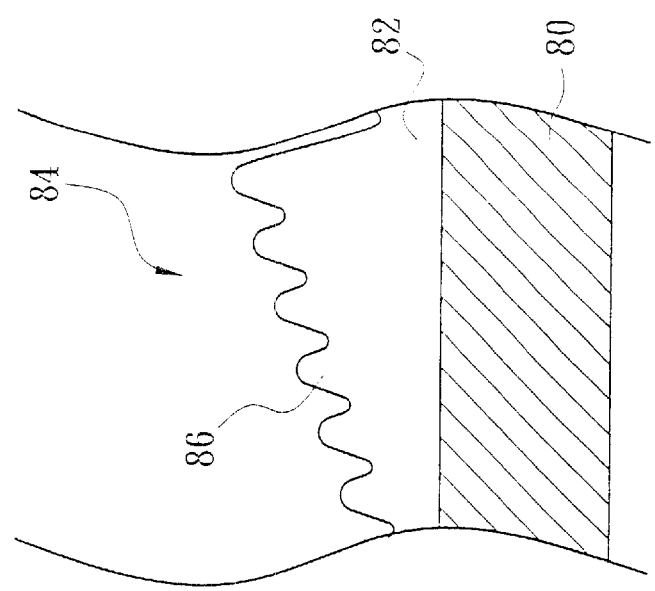
FIG. 3B illustrates a slant formed on a photoresist after the out of focus exposure step and developing step of the invention.
Figure 3A:
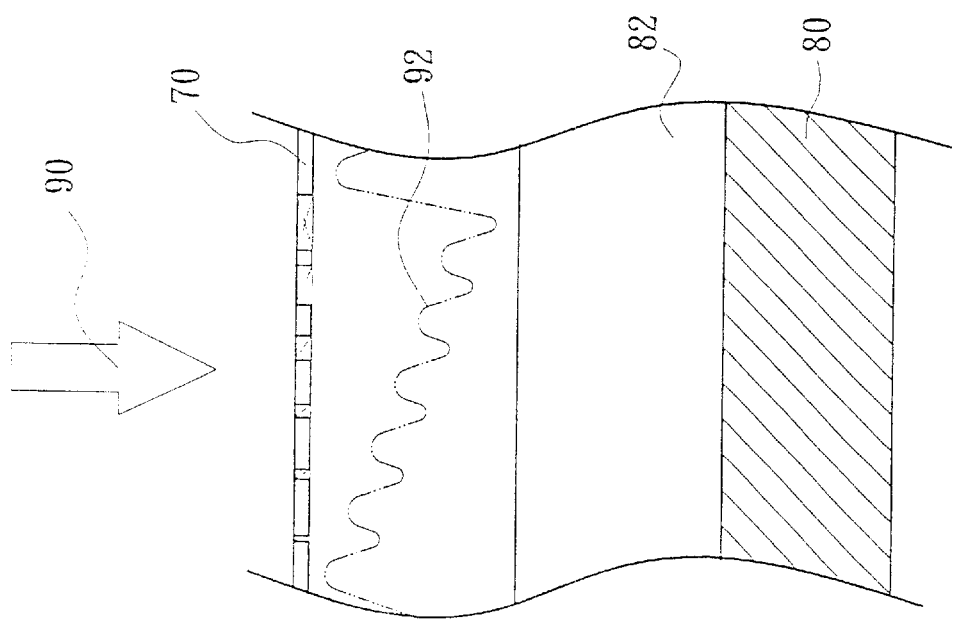
FIG. 3A illustrates out of focus Half-Tone exposure of the invention.

The out of focus half-tone exposure 40 is illustrated in FIG. 3A. A photo mask is placed on the photoresist 82 formed on the substrate 80. Light 90 is provided in order to perform the exposure step. By adjusting the out of focus distance of the photoresist 82, half-tone (changing gradually from strong to weak or from weak to strong) zigzag light intensity distribution 92 is formed on the photoresist 82 after light 90 passes through the half-tone exposure units 72. After out of focus half-tone exposure, a suitable developing step 50 is performed to form slants 84, as shown in the FIG. 3B. A plurality of ripple shaped bumps 86 of astigmatism is formed on the slants 84. In the above developing step 50, the developer (for example, PD523AD developer containing 2.38% TMAH made by JSR) is sprayed onto the photoresist 82 for 55 seconds in order to finish developing.

After the developing step 50, a drying step 60 is performed on the photoresist 82 in order to solidify the photoresist 82. The photoresist 82 flows when it is heated up before it is completely solidified, so the bumps 86 on the slants 84 become less prominent and reduce the photoresist's astigmatism. A better method is to soft bake the photoresist 82 at a lower temperature for a period of time to partially solidify the photoresist 82, then hard bake the photoresist 82 at a higher temperature to solidify completely. For example, soft bake at 100–150° C. for 5–30 minutes, then hard bake at about 220° C. for an hour and a half. In this case, the original shape of the bumps can be maintained and the photoresist's fluid behavior, which makes the bumps less prominent, is thus prevented.

Figure 4:
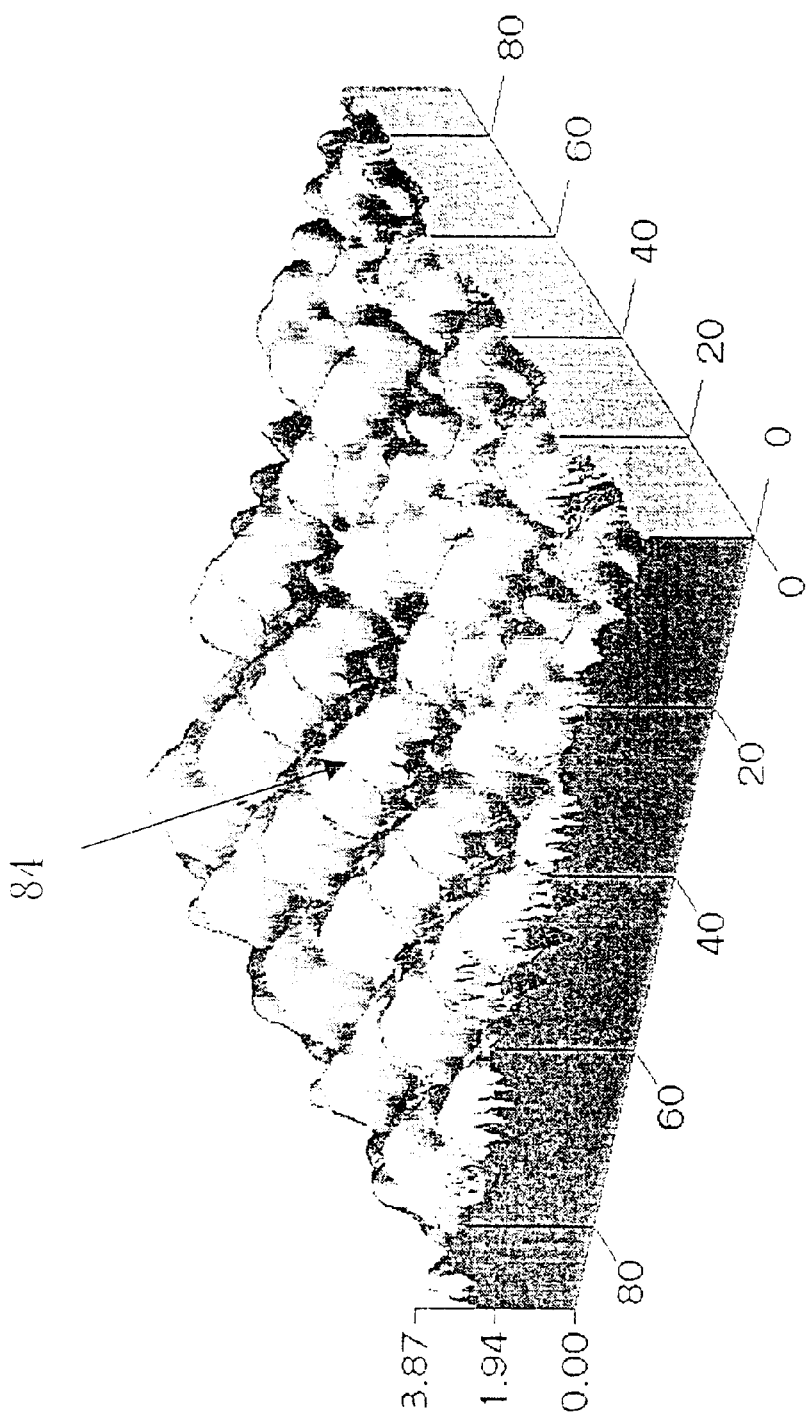
FIG. 4 illustrates the structure of the slant diffusive reflector of the invention.

After the drying step 60 is finished, the slanting diffusive reflector structure is obtained by atomic force microscopy (AFM), as shown in FIG. 4. A plurality of slants 84 is formed on the photoresist 82. The height of the slants 84 is preferably in the range of 0.5~3 $\mu$m. A better condition is to have the slants 84 randomly arranged within the range of one LCD pixel. This increases light diffusivity and prevents light diffraction resulting from uniformly arranged slants 84. A metal layer with high reflective properties can be formed on the photoresist 82 to increase light reflection. The metal layer can be, for example, silver, aluminum or any other metal with high reflective properties.

Figure 5:
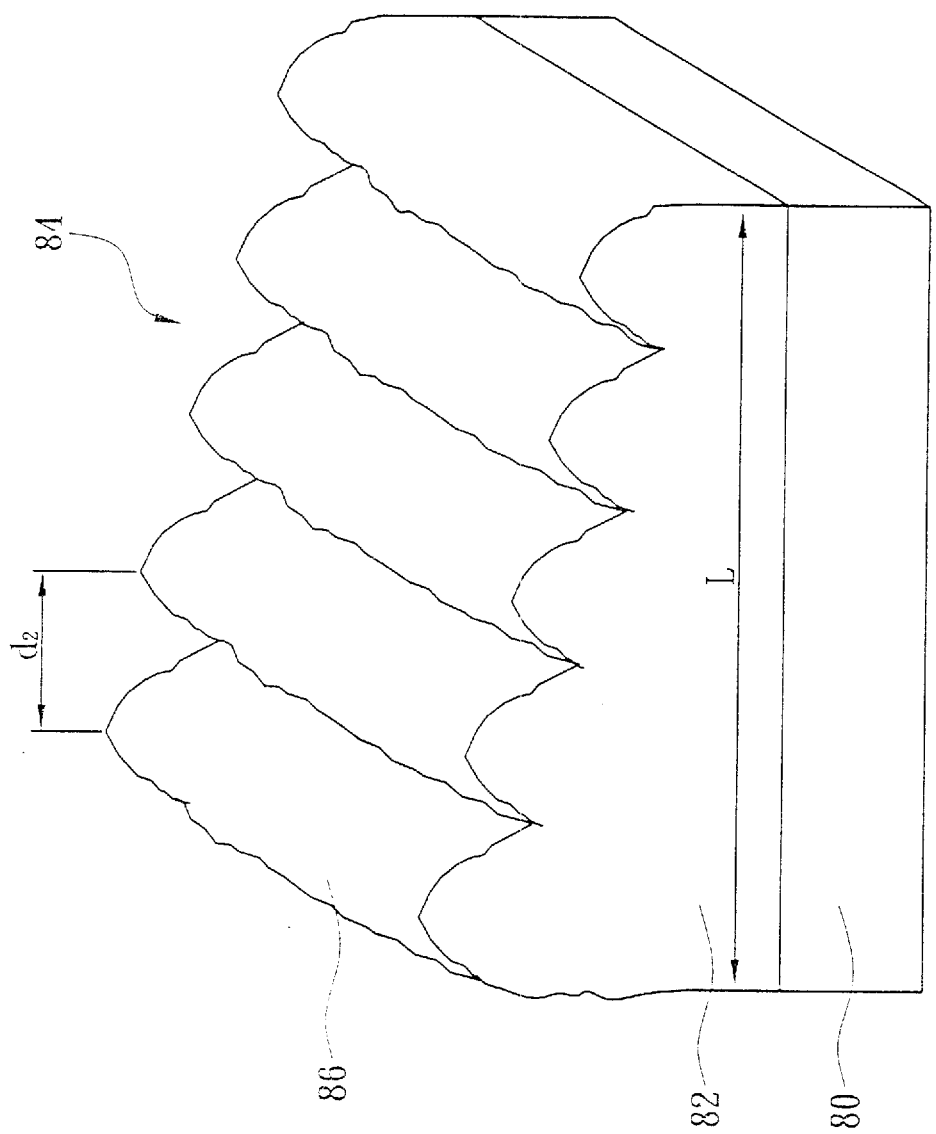
FIG. 5 illustrates the magnified structure of one slant on the slanting diffusive reflector.

FIG. 5 illustrates the magnified structure of one slant 84. The angle of the slant 84 on the substrate 80 is, for example, 4–5 degrees. The edge length of the slant 84 is about 10–40 micrometers. In order to obtain better light reflection, the pitch $d_2$ between ripple shaped bumps 86 in different slants 84 can be arbitrary.

According to the manufacturing method and structure of the invention, a special photo mask is used so only one exposure process is required to form slants and astigmatism on the slants at the same time. The manufacturing process is thus simplified and cost is reduced as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of slanting diffusive reflector comprises the following steps:

providing a substrate, forming a positive or a negative photoresist on said substrate, providing a photo mask with a plurality of half-tone exposure units, each said half-tone exposure unit comprises a plurality of parallel transmitting strips or shadow strips, performing with said photo mask out of focus exposure and developing process, in order to simultaneously form a plurality of slants with bumps on said photoresist, drying said photoresist, and forming a high reflection metal layer on said photoresist.

2. The manufacturing method of slanting diffusive reflector of claim 1, wherein an edge of said slants is about 10–40 micrometer.

3. The manufacturing method of slanting diffusive reflector of claim 1, wherein a same pitch or arbitrary pitch is obtained between said shadow strips in each of said half-tone exposure units, and the width of said shadow strips gradually changes.

4. The manufacturing method of slanting diffusive reflector of claim 3, wherein a size of said shadow strips is randomly selected in a certain range.

5. The manufacturing method of slanting diffusive reflector of claim 4, wherein a pitch between said transmitting strips or shadow strips of said half-tone exposure units and the way how the width changes are randomly selected in said certain range.

6. The manufacturing method of slanting diffusive reflector of claim 5, wherein said certain range is a pixel range.

7. A manufacturing method of slanting diffusive reflector of claim 1, wherein said dry photoresist step comprises: soft baking at 100–150° C. for 5–30 minutes, and hard baking at about 220° C. for one and a half hour.

8. The manufacturing method of slanting diffusive reflector of claim 1, wherein said high reflection metal layer is selected from the group of silver, aluminum and other high reflection metals.

9. The manufacturing method of slanting diffusive reflector of claim 1, wherein each said half-tone exposure units has a neighboring light transmitting area in the horizontal direction, the width of said light transmitting area is 1–3 micrometer.

* * * * *